(12) United States Patent
Sakamoto et al.

(10) Patent No.: US 9,209,811 B2
(45) Date of Patent: Dec. 8, 2015

(54) SEMICONDUCTOR INTEGRATED CIRCUIT DEVICE

(71) Applicant: Renesas Electronics Corporation, Kawasaki-shi, Kanagawa (JP)

(72) Inventors: Kazuo Sakamoto, Kanagawa (JP); Naozumi Morino, Kanagawa (JP); Kazuo Tanaka, Kanagawa (JP); Hiroyasu Ishizuka, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/461,163

(22) Filed: Aug. 15, 2014

(65) Prior Publication Data

US 2014/0354331 A1    Dec. 4, 2014

Related U.S. Application Data

(62) Division of application No. 13/654,415, filed on Oct. 18, 2012, now Pat. No. 8,810,278.

(30) Foreign Application Priority Data

Oct. 18, 2011    (JP) .................................. 2011-229075

(51) Int. Cl.
*H03K 19/0175*    (2006.01)
*H03K 19/08*    (2006.01)
*H01L 27/02*    (2006.01)
*H01L 27/118*    (2006.01)

(52) U.S. Cl.
CPC ............ *H03K 19/08* (2013.01); *H01L 27/0207* (2013.01); *H01L 27/0262* (2013.01); *H01L 27/11898* (2013.01); *H03K 19/0175* (2013.01); *H01L 2027/11875* (2013.01)

(58) Field of Classification Search
CPC ...................... H03K 19/0175; H01L 27/11898
USPC .............................................. 326/82, 38, 101
See application file for complete search history.

(56) References Cited

U.S. PATENT DOCUMENTS

| 4,945,395 | A  | 7/1990 | Suehiro |
| 8,386,980 | B2 | 2/2013 | Murray et al. |
| 2002/0056857 | A1 | 5/2002 | Iwasa |

(Continued)

FOREIGN PATENT DOCUMENTS

| JP | 64-18239 A | 1/1989 |
| JP | 2002-151590 A | 5/2002 |

(Continued)

OTHER PUBLICATIONS

Office Action issued Jul. 7, 2015, in Japanese Patent Application No. 2011-229075.

*Primary Examiner* — Don Le
(74) *Attorney, Agent, or Firm* — Miles & Stockbridge P.C.

(57) ABSTRACT

A semiconductor integrated circuit device comprises I/O cells arranged around a core region. Each of the I/O cells comprises a level shifter circuit, an I/O logic circuit, and an I/O buffer circuit. An I/O logic region in which the I/O logic circuit is arranged and an I/O buffer region in which the I/O buffer circuit is arranged overlap with a region in which a pad for the I/O cell is arranged. The I/O logic region and the I/O buffer region are arranged side by side in a direction parallel to a side of the core region.

8 Claims, 14 Drawing Sheets

(56) References Cited

U.S. PATENT DOCUMENTS

2007/0206781 A1 9/2007 Sasaki et al.
2013/0264647 A1 10/2013 Toba et al.

FOREIGN PATENT DOCUMENTS

| | | |
|---|---|---|
| JP | 2004-165246 A | 6/2004 |
| JP | 2005-072566 A | 3/2005 |
| JP | 2007-96216 A | 4/2007 |
| JP | 2010-161158 A | 7/2010 |

SEMICONDUCTOR INTEGRATED CIRCUIT DEVICE

TECHNICAL FIELD

Reference to Related Application

This application is based upon and claims the benefit of the priority of Japanese patent application No. 2011-229075, filed on Oct. 18, 2011, the disclosure of which is incorporated herein in its entirety by reference thereto. The present invention relates to a semiconductor integrated circuit device. In particular, it relates to a semiconductor integrated circuit device in which I/O cells including I/O buffers are arranged around a core region.

BACKGROUND

In recent years, as the performance and function of semiconductor integrated circuit devices improve, the number of inputs/outputs to/from a semiconductor integrated circuit device is increasing. Accordingly, many more I/O cells and bonding pads are being arranged around the core region of a semiconductor integrated circuit device. Namely, to decrease the area of such semiconductor integrated circuit device, it is important to decrease the area of a pad region including these I/O cells and bonding pads.

For example, Patent Literature (PTL) 1 discloses reducing the unnecessary space in an I/O region, to provide a semiconductor integrated circuit device requiring a smaller area. According to PTL 1, I/O circuit portions and electrostatic discharge (ESD) protection element portions included in the I/O region are arranged in the length direction (cross direction) of a side of the core region.

In addition, PTL 2 discloses a technique for improving EMS of an I/O circuit portion, without increasing a layout area.

[PTL 1]
Japanese Patent Kokai Publication No. JP2007-096216A (FIG. 2)
[PTL 2]
Japanese Patent Kokai Publication No. JP2004-165246A

SUMMARY

The entire disclosures of the above mentioned Patent Literatures are incorporated herein by reference thereto. The following analysis has been made by the present invention.

FIG. 11 schematically illustrates a configuration of the entire chip of a semiconductor integrated circuit device according to a related technique. In FIG. 11, the semiconductor integrated circuit device includes: a core region 160 in which CPUs, a RAM, analog regions, and the like are arranged; and pad regions 170 in which I/O cells and pads (bonding pads) 150 are arranged.

FIG. 14 illustrates a configuration of a pad region 170 in which I/O cells 140 are arranged. In FIG. 14, a plurality of I/O cells 140 and a plurality of pads 150 are arranged in the pad region 170. Each of the pads 150 is arranged to partially cover some of the I/O cells 140. Each of the I/O cells 140 includes: a level shifter region 110 in which a level shifter circuit is arranged; an I/O logic region 120 in which an I/O logic circuit is arranged; and an I/O buffer region 130 in which an I/O buffer circuit is arranged. The I/O buffer region 130 includes: resistor regions 131 and 135 in which resistive elements are arranged; an N buffer region 132 in which an N buffer (NMOS transistor) is arranged; diode element regions 133 and 134 in which diode elements are arranged; and a P buffer region 136 in which a P buffer (PMOS transistor) is arranged. Since each of the pads is used for connection to a bonding wire or the like, there is a limit to the height and the width. Namely, the pad size cannot be decreased with the I/O cell size. However, there is a technique for decreasing the area by efficiently arranging the pads. Specifically, when many I/O cells and pads are necessary for a chip size, the pads are arranged in a zigzag pattern as illustrated in FIG. 14.

In contrast, when the number of I/O cells and pads is smaller for a chip size, the pads can be arranged in a line, instead of in a zigzag pattern. FIG. 12 is a layout diagram illustrating a configuration of a semiconductor integrated circuit device including pads arranged in a line. If the I/O cells 140 illustrated in FIG. 12 are applied to a product in which the pads 150 can be arranged in a line, since the height of each I/O cell 140 is greater than that of each pad 150, it is difficult to decrease the area of the pad region 170, as illustrated in FIGS. 11 and 12.

In addition, if I/O cells are newly created for in-line pads in which pads are arranged in a line, ESD protection regions and buffer sizes need to be redesigned, requiring extra man-hours and manufacturing costs. In addition, it is difficult to obtain AC/DC characteristics equivalent to those of the I/O cells 140 for the zigzag pattern pads.

If the size of each I/O cell 140 is simply decreased in the height direction of each I/O buffer region 130, the following problems are caused. FIG. 13 is a layout diagram illustrating a configuration of power supply wirings for the I/O cells 140 illustrated in FIG. 12. In FIG. 13, the size of each I/O cell 140 is decreased in the height direction of each I/O buffer region 130.

In FIG. 13, a core power supply wiring 141 and a core ground wiring 142 supply a core power supply voltage VDD and a core ground voltage VSS to each level shifter region 110, respectively. In addition, an I/O power supply wiring 143 and an I/O ground wiring 144 supply an I/O power supply voltage VCCQ and an I/O ground voltage VSSQ to each I/O logic region 120, respectively. In addition, an I/O power supply wiring 145 and an I/O ground wiring 146 supply the I/O power supply voltage VCCQ and the I/O ground voltage VSSQ to each I/O buffer region 130, respectively.

As illustrated in FIG. 13, if the size of each I/O buffer region 130 is decreased in the height direction (the vertical direction in FIG. 13), the wiring widths of the I/O power supply wirings 143 and 145 and the I/O ground wiring 144 and 146 are accordingly narrowed, resulting in an increase of wiring resistance. Namely, if the size of each I/O cell 140 illustrated in FIG. 12 is simply decreased in the height direction of each I/O buffer region 130, since the size of the power supply wirings arranged thereabove is also decreased, the ESD characteristics and power supply characteristics could also be deteriorated.

In addition, in the semiconductor integrated circuit device disclosed in PTL 1, the I/O circuit portions and the ESD protection element portions are arranged in a direction (the cross direction) parallel to a side of the core region. In this way, the height in a direction (the vertical direction) perpendicular to the side can be decreased. However, in this semiconductor integrated circuit device, wire bonding pads (first pads) and wafer testing pads (second pads) are also arranged in the cross direction. Thus, in this way, the width of the I/O region in the cross direction is increased with the widths of these pads in the cross direction. Namely, based on the semiconductor integrated circuit disclosed in PTL 1, by decreasing the height of the I/O region, the width of the I/O region is increased. Therefore, it is difficult to decrease the area of the I/O region.

Thus, regarding a semiconductor integrated circuit device, there is a need in the art to decrease the area of each I/O cell by decreasing the height thereof without increasing the width thereof. Herein, the width of an I/O cell in a direction parallel to a side of the core region, the side along which the I/O cell is arranged, will be simply referred to as "width," and the width of the I/O cell in a direction perpendicular to this side will be referred to as "height."

According to an aspect of the present disclosure, there is provided a semiconductor integrated circuit device, comprising I/O cells arranged around a core region. Each of the I/O cells comprises a level shifter circuit, an I/O logic circuit, and an I/O buffer circuit. An I/O logic region in which the I/O logic circuit is arranged and an I/O buffer region in which the I/O buffer circuit is arranged overlap with a region in which a pad for the I/O cell is arranged. The I/O logic region and the I/O buffer region are arranged side by side in a direction parallel to a side of the core region.

The present disclosure provides the following advantage, but not restricted thereto. Based on the semiconductor integrated circuit device according to the present disclosure, by arranging the I/O logic region and the I/O buffer region side by side in the direction parallel to a side of the core region, the height of the I/O cell can be decreased. In addition, by arranging both the I/O logic region and the I/O buffer region to overlap with the region in which the pad for the I/O cell is arranged, an increase in the width of the I/O cell can be prevented. As a result, the area of the I/O cell can be decreased.

PREFERRED MODES

First, an outline of the present disclosure will be described. However, the reference symbols in the following outline are merely used as examples to facilitate understanding of the present disclosure. Therefore, the reference symbols are not intended to limit the present disclosure to the illustrated modes.

Figure 1:
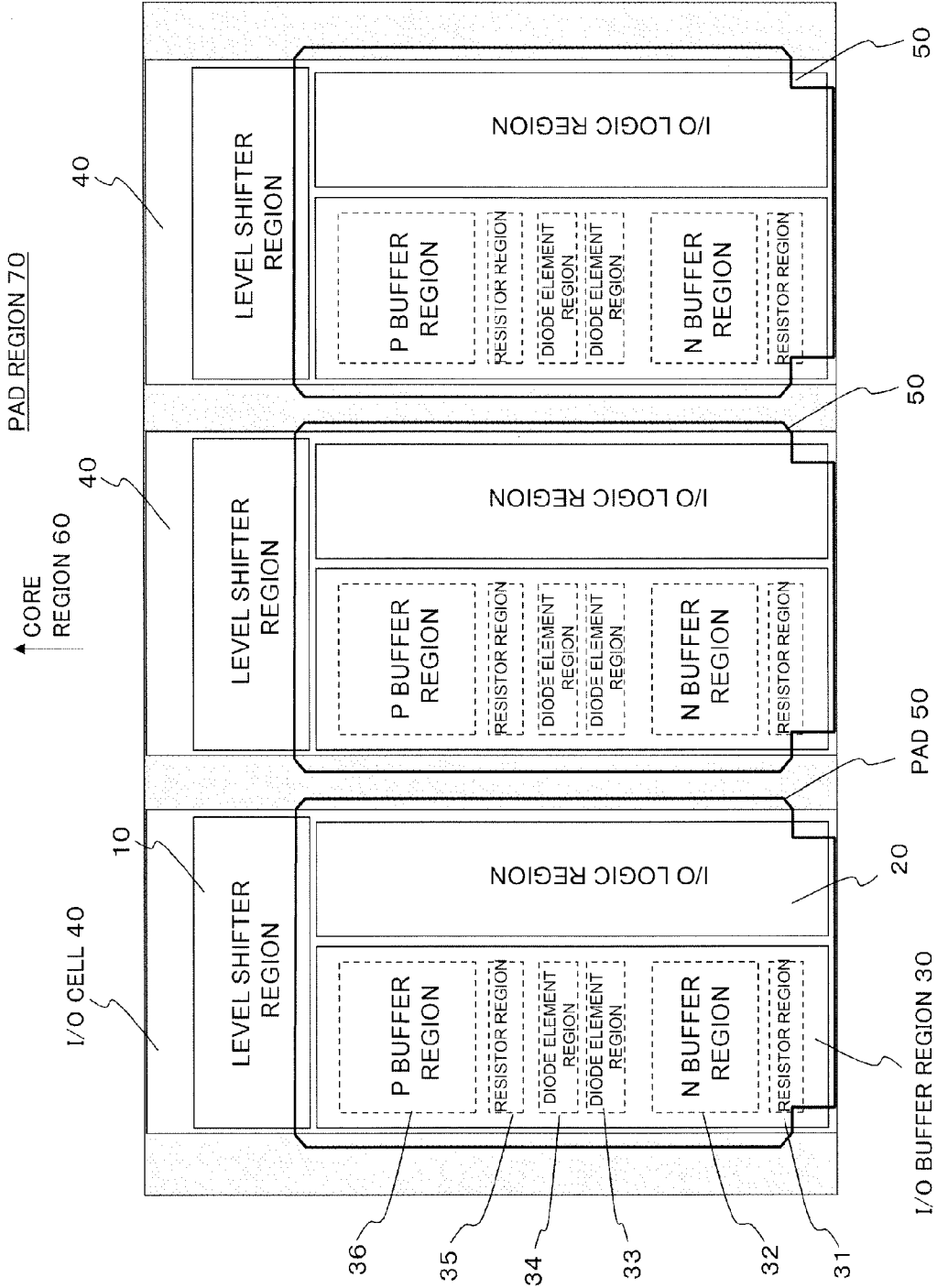
FIG. 1 is a layout diagram illustrating a configuration of a pad region in a semiconductor integrated circuit device according to a first exemplary embodiment.
Figure 2:
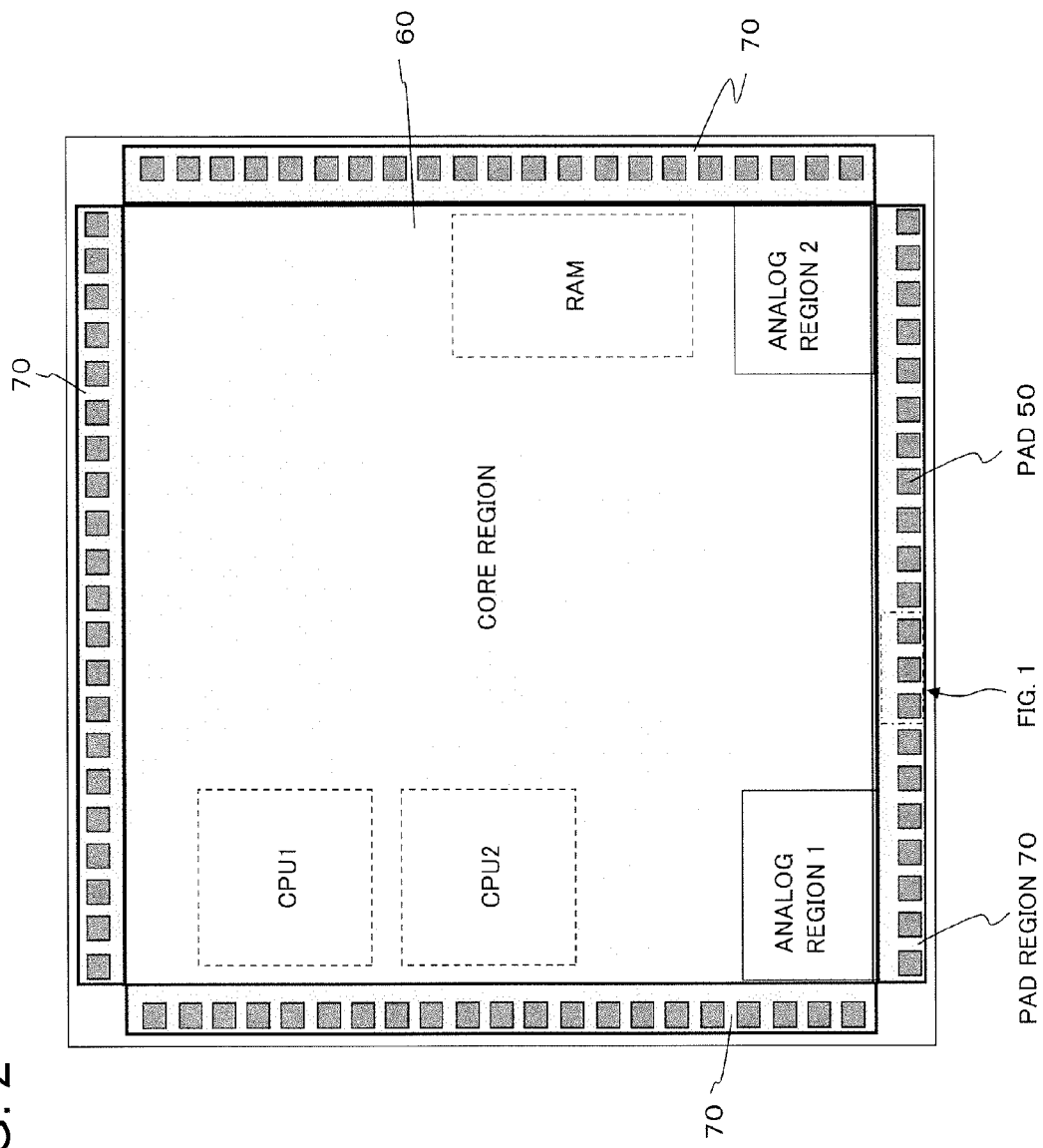
FIG. 2 schematically illustrates a configuration of the entire chip of the semiconductor integrated circuit device according to the first exemplary embodiment.

FIG. 2 is a layout diagram illustrating an overall configuration of a semiconductor integrated circuit device according to the present disclosure. FIG. 1 is a layout diagram in which a portion indicated by a dashed-dotted line in FIG. 2 is enlarged. In FIGS. 1 and 2, a semiconductor integrated circuit device according to the present disclosure comprises I/O cells (40) each including a level shifter circuit, an I/O logic circuit, and an I/O buffer circuit. The I/O cells are arranged around a core region (60). An I/O logic region (20) in which the I/O logic circuit is arranged and an I/O buffer region (30) in which the I/O buffer circuit are arranged overlapping with a region in which a pad (50) for the I/O cell (40) is arranged. The I/O logic region(s) and the I/O buffer region(s) are arranged side by side in a direction parallel to a side of the core region (60).

The I/O buffer region (30) may further include an ESD protection element region in which an ESD protection element is arranged. In addition, the I/O logic circuit may include: a circuit for controlling the I/O buffer circuit; an input circuit; a pull up/down circuit; and a control circuit therefore. In each I/O cell (40) in FIG. 1, the I/O logic region (20) and the I/O buffer region (30) are arranged in the same way. However, the I/O logic region (20) and the I/O buffer region (30) may be arranged differently (left-right reversal in FIG. 1) in an I/O cell (40).

By arranging the I/O logic region(s) (20) and the I/O buffer region(s) (30) side by side in a direction parallel to a side of the core region (60), the height of the I/O cell(s) (40) can be decreased. In addition, by arranging both the I/O logic region (20) and the I/O buffer region (30) to overlap with a region in which the pad (50) for the I/O cell (40) is arranged, an increase in the width of the I/O cell can be prevented. Thus, based on the semiconductor integrated circuit device, by decreasing the area of the I/O cell (40), the area of the pad region (70) can be decreased. Namely, the semiconductor integrated circuit device can be formed to have a smaller area than the semiconductor integrated circuit device (FIGS. 11 and 12) according to the related technique.

Figure 5:
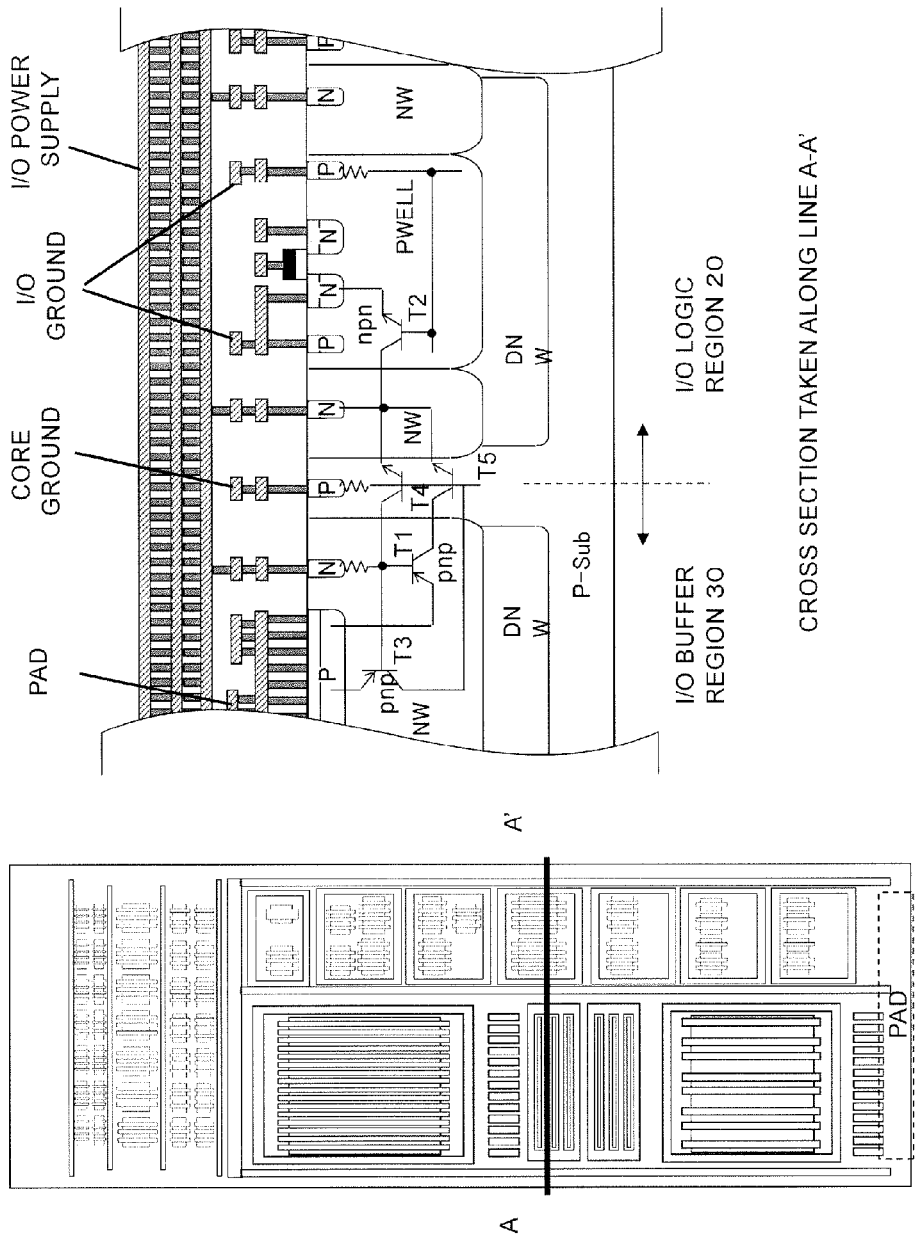
FIG. 5 illustrates a plan view and a cross section of an I/O cell of a semiconductor integrated circuit device according to a second exemplary embodiment.

As illustrated in FIG. 5, it is preferable that a deep N-well DNW included in the I/O logic region (20) and a deep N-well DNW included in the I/O buffer region (30) be separated from each other. By separating the I/O buffer region (30) and the I/O logic region (20) with use of a deep NWEL structure (DNW), a latchup can be prevented.

Figure 7:
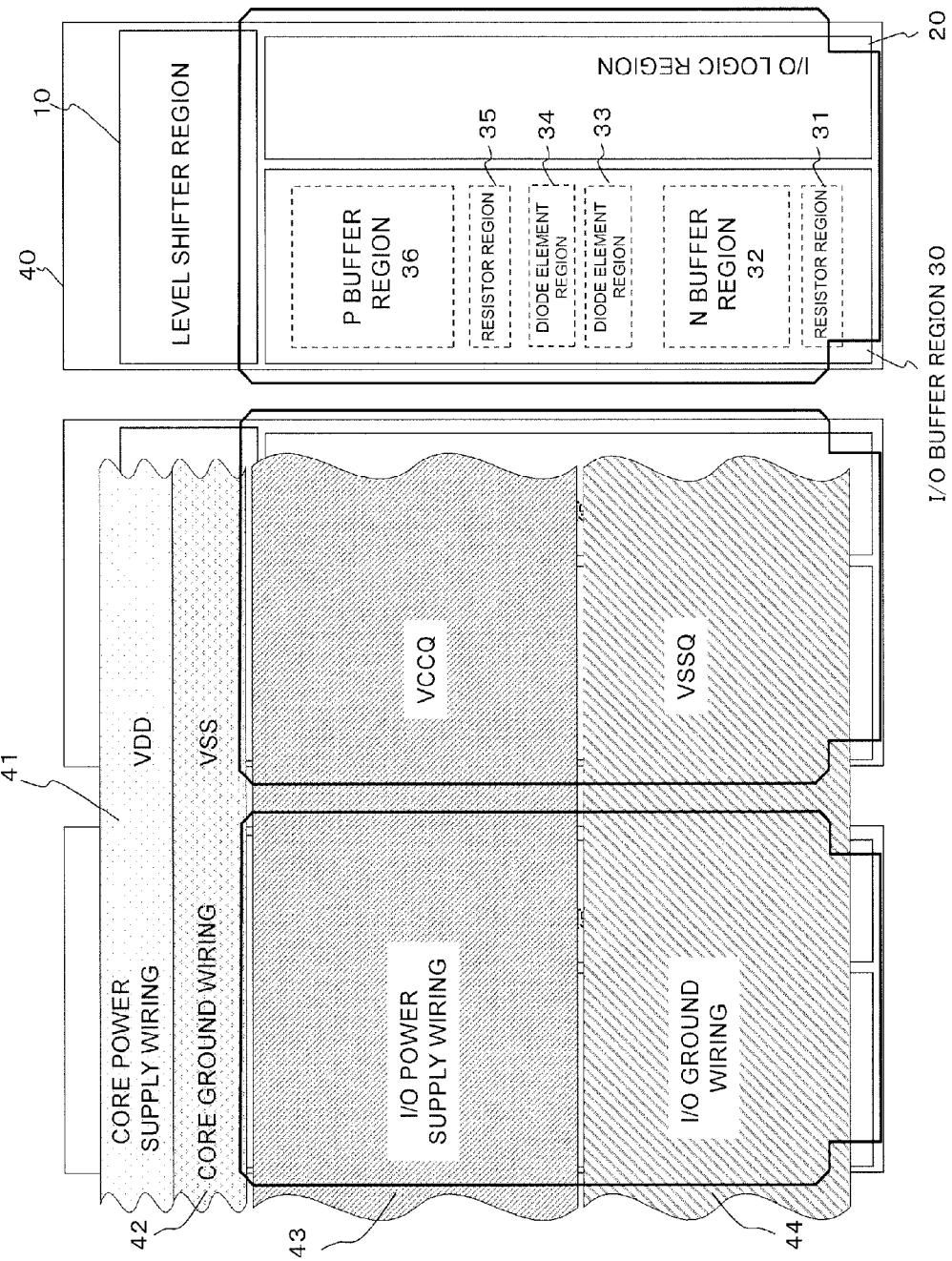
FIG. 7 is a layout diagram illustrating a configuration of power supply wirings of a semiconductor integrated circuit device according to a third exemplary embodiment.
Figure 13:
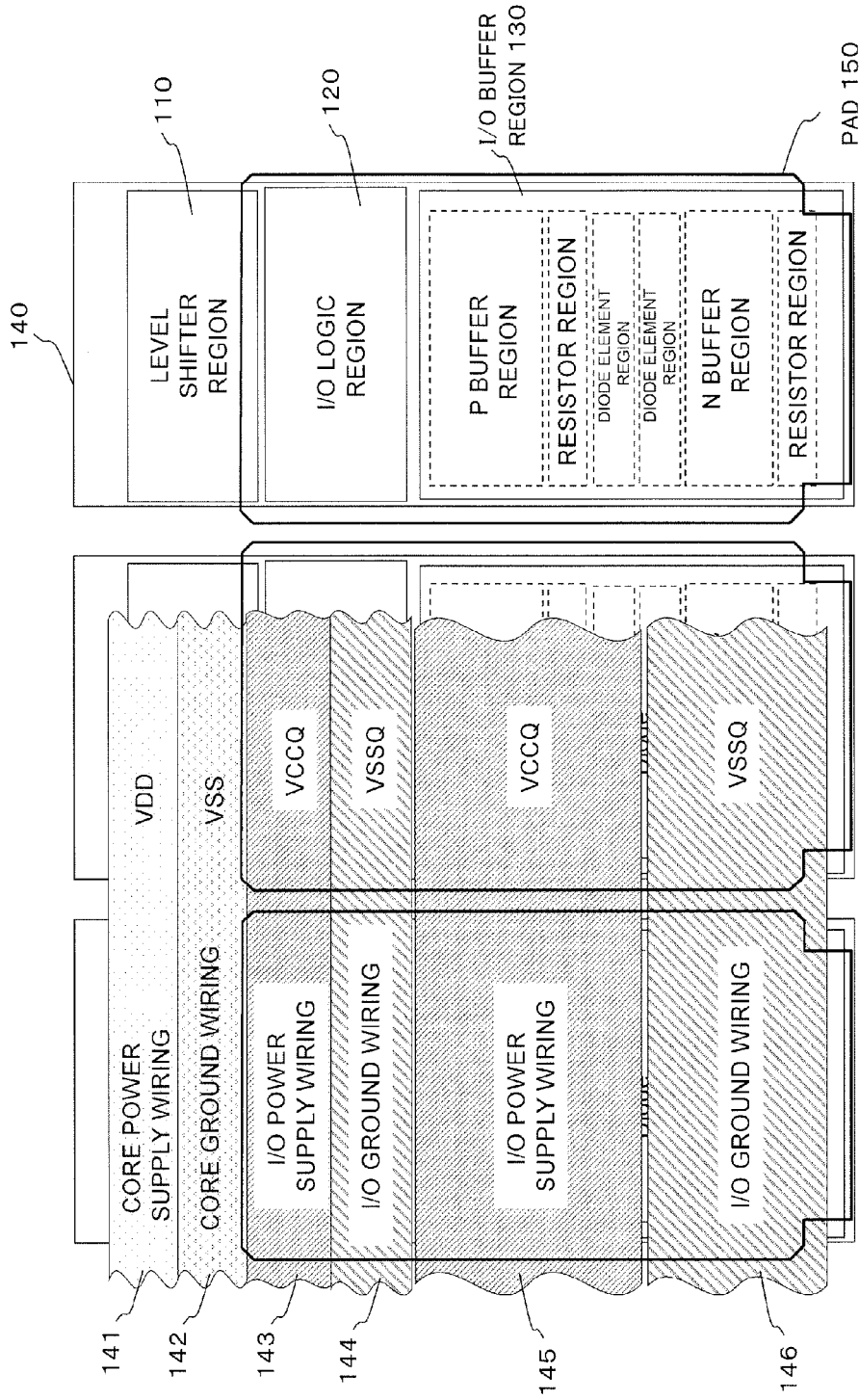
FIG. 13 is a layout diagram illustrating a configuration of power supply wirings of the semiconductor integrated circuit device according to related technique.
Figure 14:
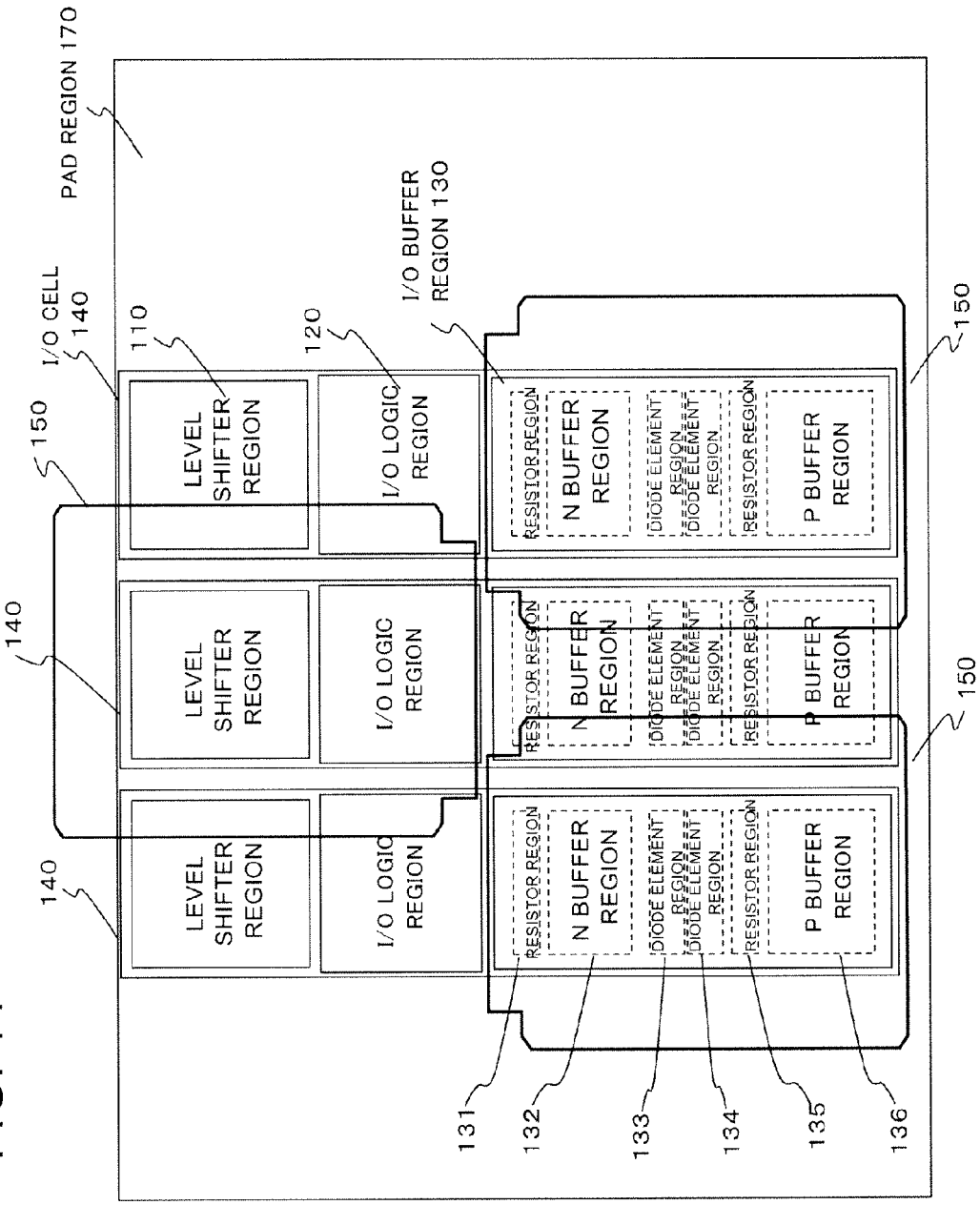
FIG. 14 is a layout diagram illustrating a configuration of a pad region of the semiconductor integrated circuit device according to the related technique.

As illustrated in FIG. 7, it is preferable that the I/O logic circuit and the I/O buffer circuit share a first wiring (I/O power supply wiring 43) supplying a first voltage (I/O power supply voltage VCCQ) and a second wiring (I/O ground wiring 44) supplying a second voltage (I/O ground voltage VSSQ). In this way, the power-supply peripheral wirings connected to the I/O cell (40) can have a wider width than those of the semiconductor integrated circuit (FIG. 13) according to the related technique. Thus, power can be supplied more stably.

Figures 8A, 8B:
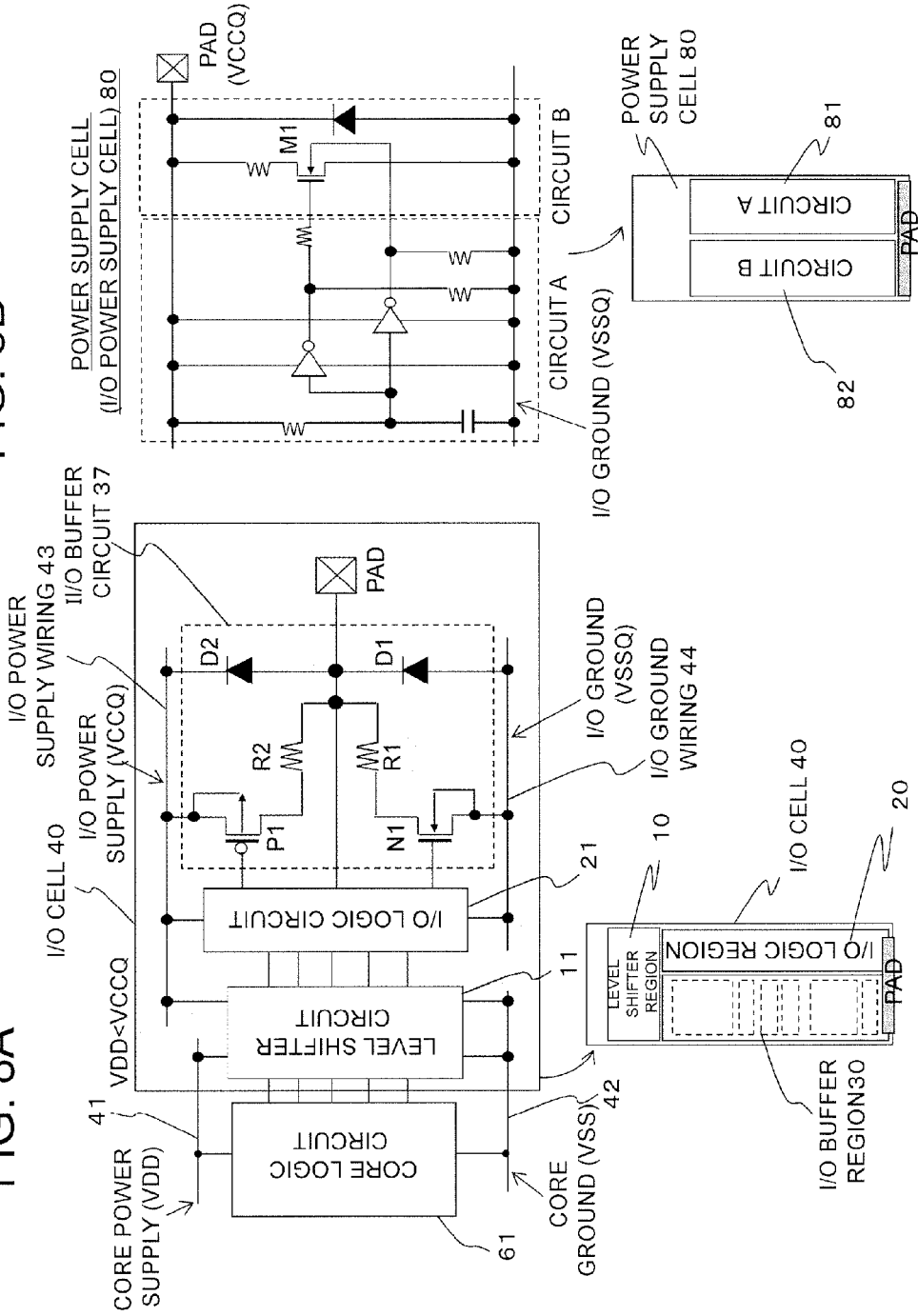
FIGS. 8A and 8B are block diagrams and layout diagrams illustrating configurations of an I/O cell and a power supply cell of the semiconductor integrated circuit device according to the third exemplary embodiment.

As illustrated in FIG. 7 and FIG. 8A, it is preferable that the I/O buffer circuit (37) include a P buffer (PMOS transistor P1) and an N buffer (NMOS transistor N1) and that a P buffer region (36) in which the P buffer (P1) is arranged be arranged beside a level shifter region (10) in which the level shifter circuit (11) is arranged. In this way, a common I/O power supply voltage (VCCQ) can easily be supplied to the level shifter circuit (11) and the P buffer (P1).

As illustrated in FIG. 8A, the I/O buffer region (30) may include a PMOS transistor (P1), an NMOS transistor (N1), first and second resistive elements (R2 and R1), and first and second diode elements (D2 and D1). The PMOS transistor (P1) may include a gate terminal connected to the IO logic circuit (21), one of a source terminal and a drain terminal connected to a back-gate terminal and the first wiring (I/O power supply wiring 43), and the other one of the terminals connected to a first terminal of the first resistive element (R2). The first resistive element (R2) may include a second terminal connected to the pad (PAD), and the first diode element (D2) may be connected between the first wiring (43) and the pad (PAD). The NMOS transistor (N1) may include a gate terminal connected to the IO logic circuit (21), one of a source terminal and a drain terminal is connected to a back-gate terminal and the second wiring (I/O ground wiring 44), and the other one of the terminals is connected to a first terminal of the second resistive element (R1). The second resistive element (R1) may include a second terminal connected to the pad (PAD), and the second diode element (D1) may be connected between the second wiring (44) and the pad (PAD).

Figure 9B:
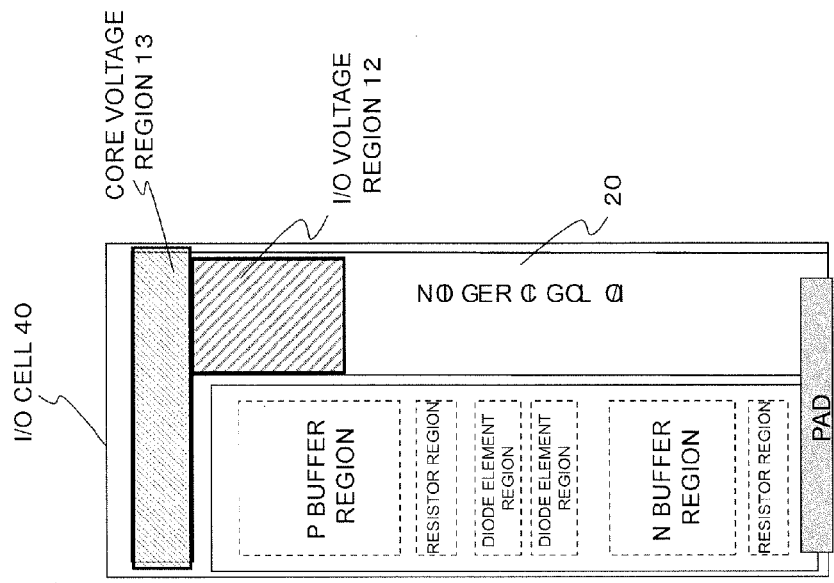
FIGS. 9A and 9B are layout diagrams illustrating a configuration of a semiconductor integrated circuit device according to a fourth exemplary embodiment.
Figure 9A:
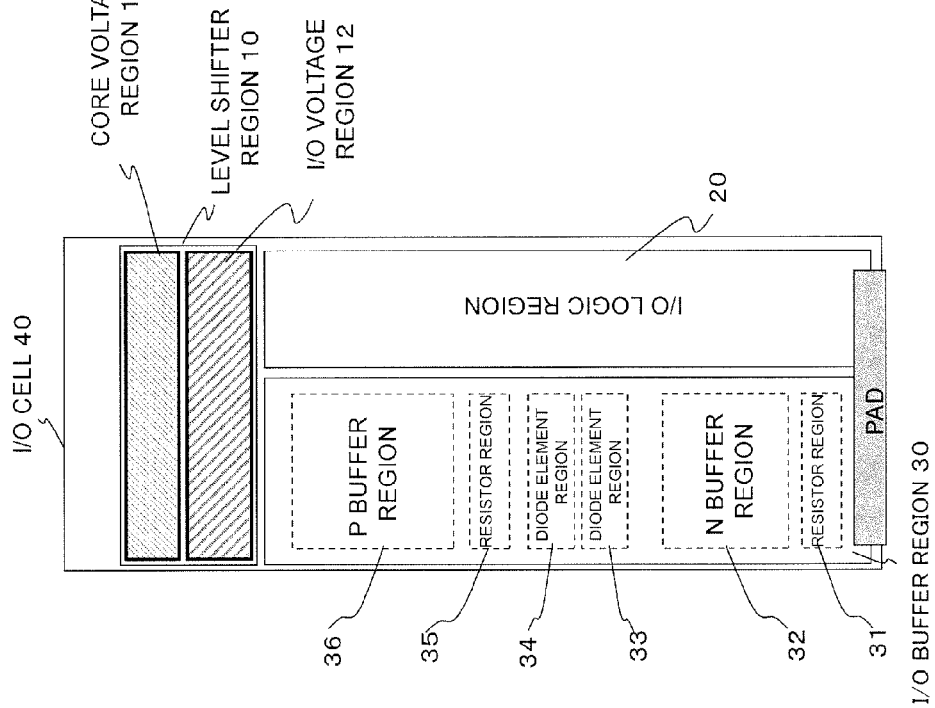

As illustrated in FIG. 8A, FIGS. 9A and 9B, it is preferable that the level shifter region (10) in which the level shifter circuit (11) is arranged include: a first voltage region (I/O voltage region 12) in which a circuit supplying a first power supply voltage (I/O power supply voltage VCCQ) to the I/O logic circuit (21) is arranged; and a second voltage region (core voltage region 13) in which a circuit supplying a second power supply voltage (core power supply voltage VDD) to the core logic circuit (61) is arranged. In addition, it is preferable that the first voltage region (12) be arranged within the I/O logic region (20) and that the second voltage region (13) be arranged between the core region (60) and a pair of the I/O logic region (20) and the I/O buffer region (30). With this configuration, the height of the I/O cell (40) can be decreased further.

(First Exemplary Embodiment)

A semiconductor integrated circuit device according to a first exemplary embodiment will be described with reference to the drawings. FIG. 1 is an enlarged view of a configuration of a pad region in a semiconductor integrated circuit device according to the present exemplary embodiment. In FIG. 1, a plurality of I/O cells 40 are arranged in a pad region 70. In addition, each of the I/O cells 40 includes: a level shifter region(s) 10 in which a level shifter circuit is arranged; an I/O logic region(s) 20 in which an I/O logic circuit is arranged; and an I/O buffer region(s) 30 in which an I/O buffer circuit is arranged.

The level shifter region(s) 10 is arranged along a side of a core region 60. The I/O logic region(s) 20 and the I/O buffer region(s) 30 are arranged side by side in a direction (the cross direction in FIG. 1) parallel to the side of the core region 60. In addition, both the I/O logic region 20 and the I/O buffer region 30 overlap with a region in which a pad (bonding pad) 50 for the corresponding I/O cell 40 is arranged.

Figure 12:
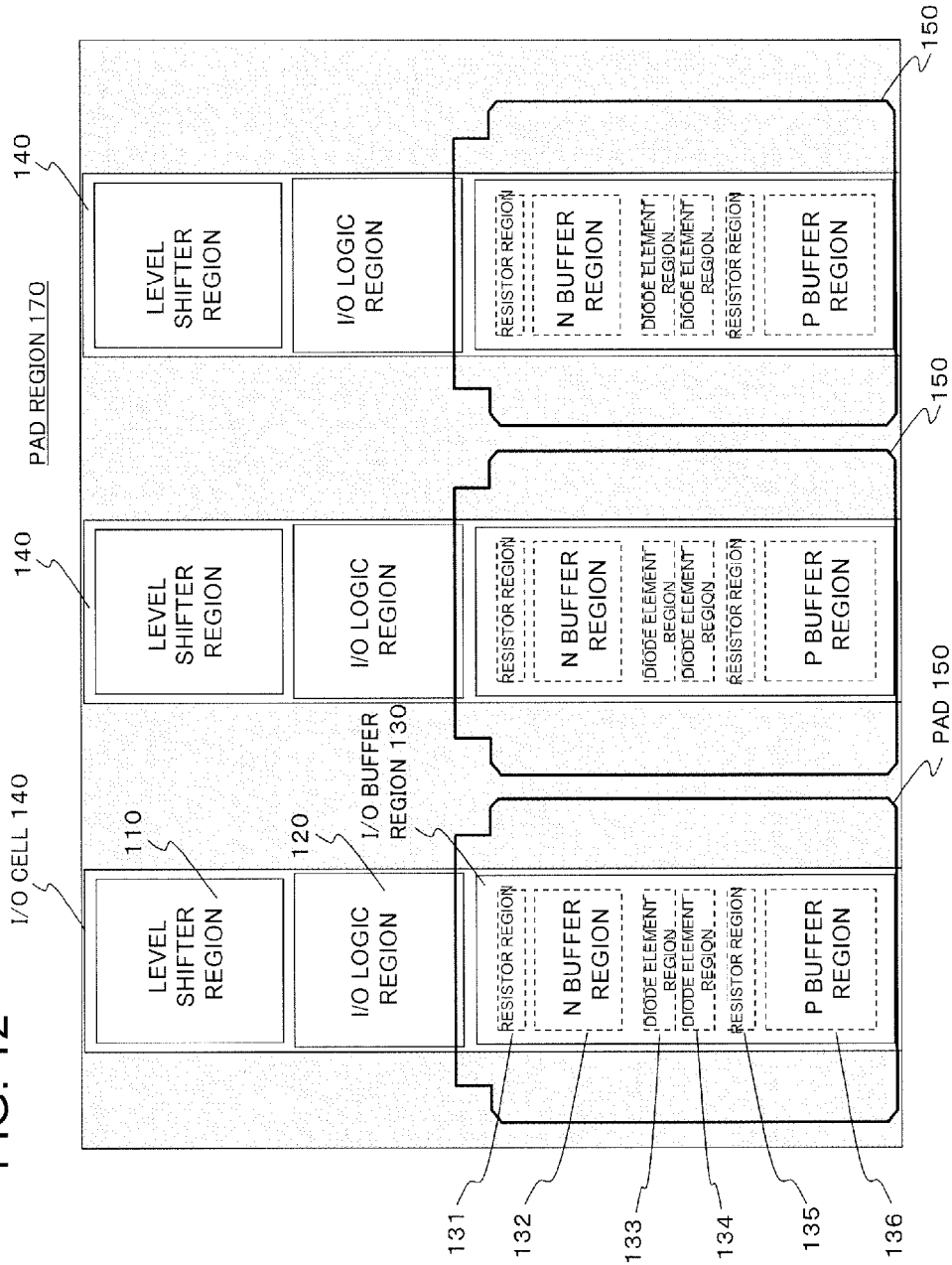
FIG. 12 is a layout diagram illustrating a configuration of a pad region of the semiconductor integrated circuit device according to the related technique.

By arranging the I/O logic region 20 and the I/O buffer region 30 side by side in the direction parallel to the side of the core region, the I/O cell 40 can have a height less than any one of the I/O cells 140 in which the I/O logic region 120 and the I/O buffer region 130 are arranged in the vertical direction as illustrated in FIG. 12. In addition, by arranging both the I/O logic region 20 and the I/O buffer region 30 to overlap with the region in which the pad 50 for the corresponding I/O cell 40 is arranged, an increase in the width of the I/O cell (in the cross direction in FIG. 1) can be prevented. Thus, based on the semiconductor integrated circuit device according to the present exemplary embodiment, since the area of each I/O cell 40 is decreased, the pad region 70 requires a smaller area than the pad region 170 according to the related technique.

FIG. 2 schematically illustrates a configuration of the entire chip of the semiconductor integrated circuit device according to the present exemplary embodiment. As an example, an overall view of the semiconductor chip is illustrated in FIG. 2 in which the I/O cells 40 according to the present exemplary embodiment are used and the pads 50 are arranged in a line. In FIG. 2, the semiconductor integrated circuit device includes: the core region 60; and the pad regions 70 arranged around the core region 60. In each of the pad regions 70, a plurality of I/O cells 40 and pads 50 for the respective I/O cells 40 are arranged.

Based on the semiconductor integrated circuit device according to the present exemplary embodiment, each pad region 70 can be formed to have a smaller area than the pad region 170 (FIG. 12) in the semiconductor integrated circuit device according to the related technique. As a result, the device can have a smaller size than the semiconductor integrated circuit device (FIG. 11) according to the related technique. The inventors confirmed that the size of each I/O cell 40 (FIG. 1) according to the present exemplary embodiment can be decreased in the height direction by 56 um compared with any one of the I/O cells 140 (FIG. 12) according to the related technique and that the chip size can be decreased by 112 um (56 um (one side)×2=112 um).

Each of the I/O buffer regions 30 may include ESD protection resistors (resistive elements R1 and R2 and diode elements D1 and D2) and output buffers (NMOS buffer N1 and PMOS buffer P1), as illustrated in FIGS. 8A and 8B. By forming these components identical to those arranged in each of the buffer regions in the zigzag-pattern-pad I/O cells according to the related technique, ESD resistance properties and AC/DC characteristics of the buffer identical to those of the I/O buffer according to the related technique can be achieved.

Figure 11:
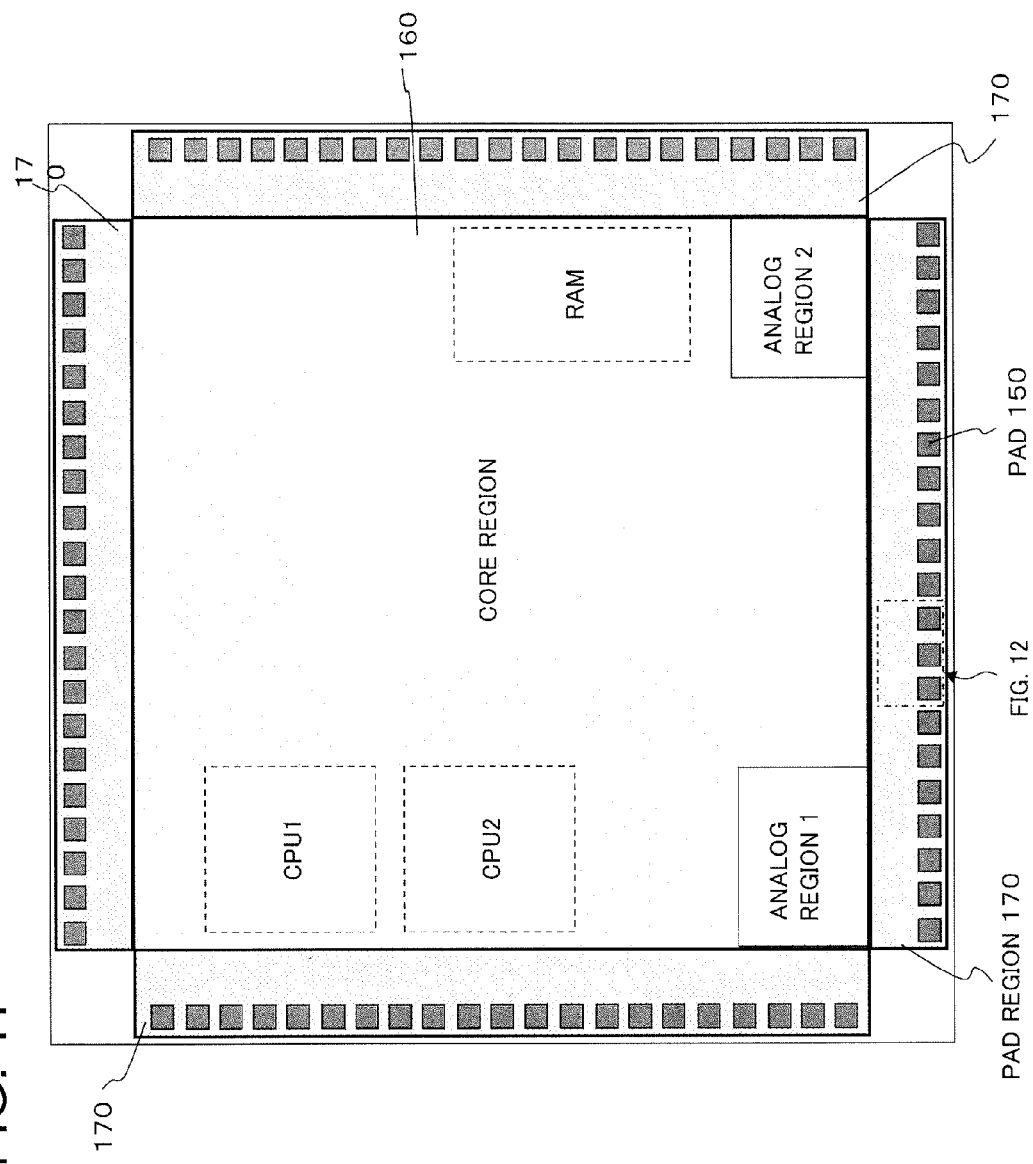
FIG. 11 schematically illustrates a configuration of the entire chip of a semiconductor integrated circuit device according to a related technique.

According to the related technique, each I/O logic region 120 is arranged on (in the vertical direction in FIG. 12) an I/O buffer region 130 in the semiconductor integrated circuit device (FIGS. 11 and 12). However, according to the present exemplary embodiment, each I/O logic region 20 is arranged beside an I/O buffer region 30. Consequently, the height (in the vertical direction in FIG. 1) of each I/O cell 40 can be decreased. In addition, the pads 50 are arranged at minimum intervals of 65 um, and the width (in the cross direction in FIG. 1) of each I/O cell 40 is set to be less than the minimum intervals.

In the present exemplary embodiment, each I/O cell 40 can be formed to have a lower height by arranging the I/O logic region 20 and the I/O buffer region 30 side by side in a direction parallel to a side of the core region 60. In addition, by arranging both the I/O logic region 20 and the I/O buffer region 30 to overlap with the region in which the pad 50 for the corresponding I/O cell 40 is arranged, an increase in the width of the I/O cell 40 is prevented. As a result, each I/O cell 40 can have a significantly smaller area than any one of the I/O cells 140 according to the related technique.

(Second Exemplary Embodiment)

A semiconductor integrated circuit device according to a second exemplary embodiment will be described with reference to the drawings. If each I/O logic region 20 is arranged beside an I/O buffer region 30 as in the first exemplary embodiment, a latchup is caused easily. In the present exemplary embodiment, a semiconductor integrated circuit device including a configuration for preventing a latchup is provided.

Figure 3:
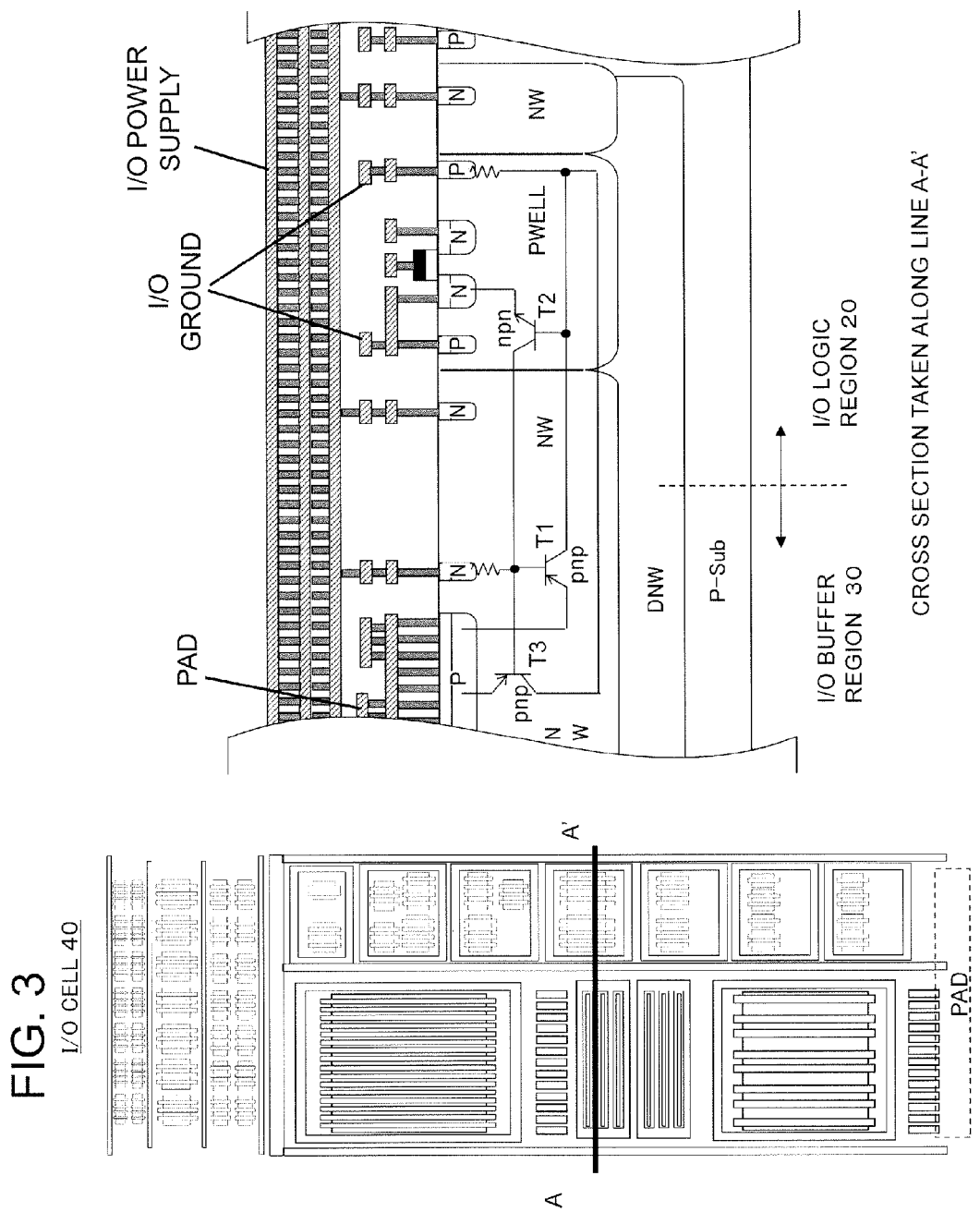
FIG. 3 illustrates a plan view and a cross section of an I/O cell of a semiconductor integrated circuit device before measures against a latchup are taken.

First, a mechanism of causing a latchup will be described with reference to FIGS. 3 and 4. FIG. 3 illustrates a plan view of an I/O cell 40 of a semiconductor integrated circuit device and a cross section taken along line A-A'. In FIG. 3, the semiconductor integrated circuit device has a deep N-well (DNL) structure, and the I/O buffer region 30 and the I/O logic region 20 are not separated.

As illustrated in FIG. 3, a P-NW-PW-N parasitic thyristor element is formed in a P region P immediately under a pad PAD, an N-type well NW extending in the I/O buffer region 30 and I/O logic region 20, a P-type well PW in the I/O logic region 20, and an N region N immediately under an I/O ground.

Figure 4:
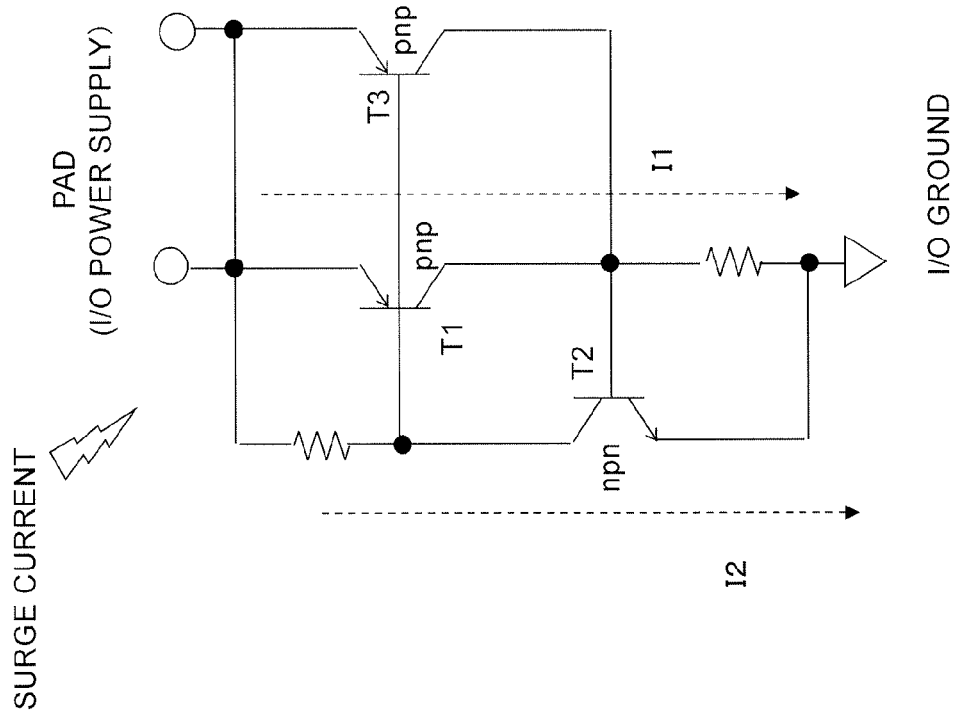
FIG. 4 illustrates a problematic point of the semiconductor integrated circuit device caused before measures against a latchup are taken.

FIG. 4 is an equivalent circuit corresponding to the cross section in FIG. 3. If a surge current flows from the pad PAD, a base current from a transistor T1 flows in the direction of a current I1. If the current I1 flows, a transistor T2 is brought in an on-state. As a result, a current I2 flows. If such phenomenon is caused, unless the power supply is turned off, the current endlessly continues to flow, which leads to destruction of an element.

Namely, if the configuration illustrated in FIG. 3 is used, since a thyristor structure is formed by parasitic transistors, a surge current from the pad PAD causes a latchup and an overcurrent. As a result, an element could be destroyed.

FIG. 5 illustrates a configuration illustrating a semiconductor integrated circuit device according to the present exemplary embodiment. FIG. 5 is a plan view of an I/O cell 40 of the semiconductor integrated circuit device and a cross section taken along line A-A'. In FIG. 5, the semiconductor integrated circuit device has a deep N-well (DNL) structure, and the I/O buffer region 30 and the I/O logic region 20 are separated.

In FIG. 5, a deep N well structure is used, and the I/O buffer region 30 and the I/O logic region 20 are divided. Namely, an N well NW and the deep N well DNW in the I/O logic region 20 are separated from the N well NW and the deep N well DNW in the I/O buffer region 30 by a P-type substrate P-Sub.

Figure 6:
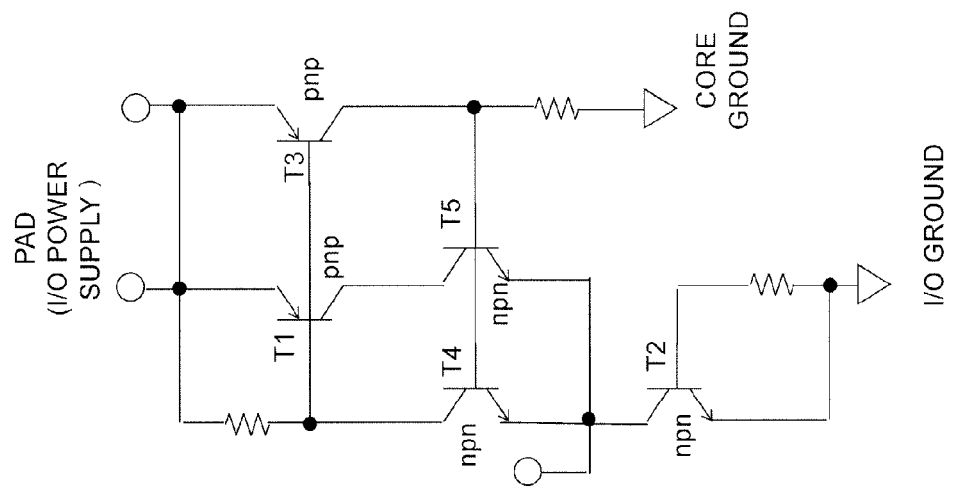
FIG. 6 illustrates a meritorious effect obtained by the semiconductor integrated circuit device according to the second exemplary embodiment.

FIG. 6 is an equivalent circuit corresponding to the cross section in FIG. 5. As is clear from FIGS. 5 and 6, based on the semiconductor integrated circuit device according to the present exemplary embodiment, a thyristor structure is not formed by parasitic transistors as illustrated in FIG. 3.

Thus, as illustrated in FIG. 5, by using the deep N wells DNWs and achieving element separation, a latchup caused by a surge current from the pad PAD can be prevented. In addition, with this configuration, the distance between the buffer circuit and the logic circuit can be shorted, and an increase in the width of each I/O cell 40 (in the cross direction in FIG. 1) can be prevented. In addition, with the configuration illustrated in FIG. 5, even if a current flows through the I/O buffer region 30 and a noise is caused, since the I/O logic region 20 also has a DNW structure, a malfunction by noise propagation is rarely caused, counted as a meritorious effect.

(Third Exemplary Embodiment)

A semiconductor integrated circuit device according to a third exemplary embodiment will be described with reference to the drawings. As described above with reference to FIG. 13, if the size of each I/O cell 140 of the semiconductor integrated circuit (FIGS. 11 and 12) according to the related technique is decreased in the height direction (the vertical direction in FIG. 13), the widths of the I/O power supply wirings 143 and 145 and the I/O ground wirings 144 and 146 are decreased. As a result, the power supply characteristics are deteriorated. In the present exemplary embodiment, a semiconductor integrated circuit device that does not have such problem is provided.

FIG. 7 is a layout diagram illustrating a configuration of power supply wirings of a semiconductor integrated circuit device according to the present exemplary embodiment. FIG. 7 illustrates power-supply peripheral wirings formed in a wiring layer above the I/O cells 40.

In FIG. 7, the I/O logic circuit arranged in each I/O logic region 20 and the I/O buffer circuit arranged in each I/O buffer region 30 share an I/O power supply wiring 43 supplying an I/O power supply voltage VCCQ and an I/O ground wiring 44 supplying an I/O ground voltage VSSQ. Namely, based on the semiconductor integrated circuit device according to the present exemplary embodiment, the I/O power supply wiring 43 and the I/O ground wiring 44 are shared by each I/O buffer region 30 and each I/O logic region 20.

If the size of each I/O cell 140 is decreased in the height direction as in the semiconductor integrated circuit device according to the related technique, the widths of all the I/O power supply wirings 143 and 145 and the I/O ground wirings 144 and 146 are decreased. In contrast, according to the present exemplary embodiment, the power-supply peripheral wirings, that is, the I/O power supply wiring 43 and the I/O ground wiring 44 connected to the I/O cells 40, can be formed to have a wider width than those of the semiconductor integrated circuit according to the related technique. Thus, power can be supplied more stably, and the ESD resistance properties can be improved.

FIGS. 8A and 8B illustrate block diagrams and layout diagrams illustrating configurations of an I/O cell 40 and a power supply cell 80 of the semiconductor integrated circuit device according to the present exemplary embodiment. FIG. 8A is a block diagram and a layout diagram illustrating a configuration of an I/O cell 40. FIG. 8A illustrates an I/O cell 40 and a core logic circuit 61 arranged in the core region 60 (FIG. 2). In FIG. 8A, the I/O cell 40 includes a level shifter circuit 11, an I/O logic circuit 21, and an I/O buffer circuit 37. The level shifter circuit 11, the I/O logic circuit 21, and the I/O buffer circuit 37 are arranged in a level shifter region 10, an I/O logic region 20, and an I/O buffer region 30 in FIG. 7, respectively.

The I/O buffer circuit 37 includes a P buffer (PMOS transistor) P1, an N buffer (NMOS transistor) N1, resistive elements R1 and R2, and diode elements D1 and D2. The P buffer P1, the resistive element R2, the diode element D2, the diode element D1, the N buffer N1, and the resistive element R1 are arranged in a P buffer region 36, a resistor region 35, a diode element region 34, a diode element region 33, an N buffer region 32, and an resistor region 31 in FIG. 7, respectively.

The core logic circuit 61 is connected to the level shifter circuit 11 of the I/O cell 40 and is supplied with a core power supply voltage VDD and a core ground voltage VSS. The level shifter circuit 11 is connected to the core logic circuit 61 and the I/O logic circuit 21 and is supplied with the core power supply voltage VDD, the I/O power supply voltage VCCQ, and the core ground voltage VSS. The I/O logic circuit 21 is connected to the level shifter circuit 11 and gate nodes of the P buffer P1 and the N buffer N1 and is supplied with the I/O power supply voltage VCCQ and the I/O ground voltage VSSQ. The P buffer P1 is connected between the I/O power supply wiring 43 and the resistive element R2. The resistive element R2 is connected between the P buffer P1 and the pad PAD. The diode element D2 is connected between the I/O power supply wiring 43 and the pad PAD. The N buffer N1 is connected between the I/O ground wiring 44 and the resistive element R1. The resistive element R1 is connected between the N buffer N1 and the pad PAD. The diode element D1 is connected between the I/O ground wiring 44 and the pad PAD.

In FIGS. 7 and 8A, the P buffer region 36 in which the P buffer P1 is arranged is arranged beside the level shifter region 10 in which the level shifter circuit 11 is arranged. In this way, a common I/O power supply voltage VCCQ can easily be supplied to the level shifter circuit 11 and the P buffer P1.

FIG. 8B illustrates a circuit diagram and a layout diagram of the power supply cell 80. FIG. 8B illustrates a configuration of an I/O power supply cell, as an exemplary power supply cell. In FIG. 8B, the power supply cell 80 includes circuits A and B. The circuit A includes a capacitive element C1, resistive elements R3 to R6, and inverters IN1 and IN2. The circuit B includes a resistive element R7, a MOS transistor M1, and a diode element D3.

Regarding this power supply cell 80, too, as the lower diagram in FIG. 8B illustrates, by arranging a circuit A region 81 in which the circuit A is arranged and a circuit B region 82 in which the circuit B is arranged side by side in a direction (the cross direction in FIG. 1) parallel to a side of the core region 60, as in the I/O cell 40 illustrated in FIG. 8A, the size in the vertical direction (the vertical direction in FIG. 8B) can be decreased.

(Fourth Exemplary Embodiment)

A semiconductor integrated circuit device according to a fourth exemplary embodiment will be described with reference to the drawings. The present exemplary embodiment provides a variation of the I/O cells 40 of the semiconductor integrated circuit device according to the first exemplary embodiment. FIGS. 9A and 9B are layout diagrams illustrating a configuration illustrating a semiconductor integrated circuit device according to the present exemplary embodiment.

In the first exemplary embodiment, as illustrated in FIG. 1, each level shifter region 10 in which a level shifter circuit is arranged and each I/O logic region 20 in which an I/O logic circuit is arranged are separated. In the present exemplary embodiment, by moving part of each level shifter circuit to the corresponding I/O logic region, the height (in the vertical direction in FIGS. 9A and 9B) of each I/O cell 40 can be further decreased.

In FIGS. 8A and 9, the level shifter region 10 in which the level shifter circuit 11 is arranged includes: an I/O voltage region 12 in which a circuit supplying the I/O power supply voltage VCCQ to the I/O logic circuit 21 is arranged; and a core voltage region 13 in which a circuit supplying the core power supply voltage VDD to the core logic circuit 61 is arranged. In the present exemplary embodiment, the I/O voltage region 12 is arranged within the I/O logic region 20, and the core voltage region 13 is arranged between the core region 60 (not illustrated in FIGS. 9A and 9B) and a pair of the I/O logic region 20 and the I/O buffer region 30.

With this configuration (FIG. 9B) according to the present exemplary embodiment, the height of each I/O cell 40 can be decreased further than the I/O cell 40 (FIG. 9A) in which all the circuits forming the level shifter circuit 11 are arranged in the level shifter region 10.

(Fifth Exemplary Embodiment)

Figure 10:
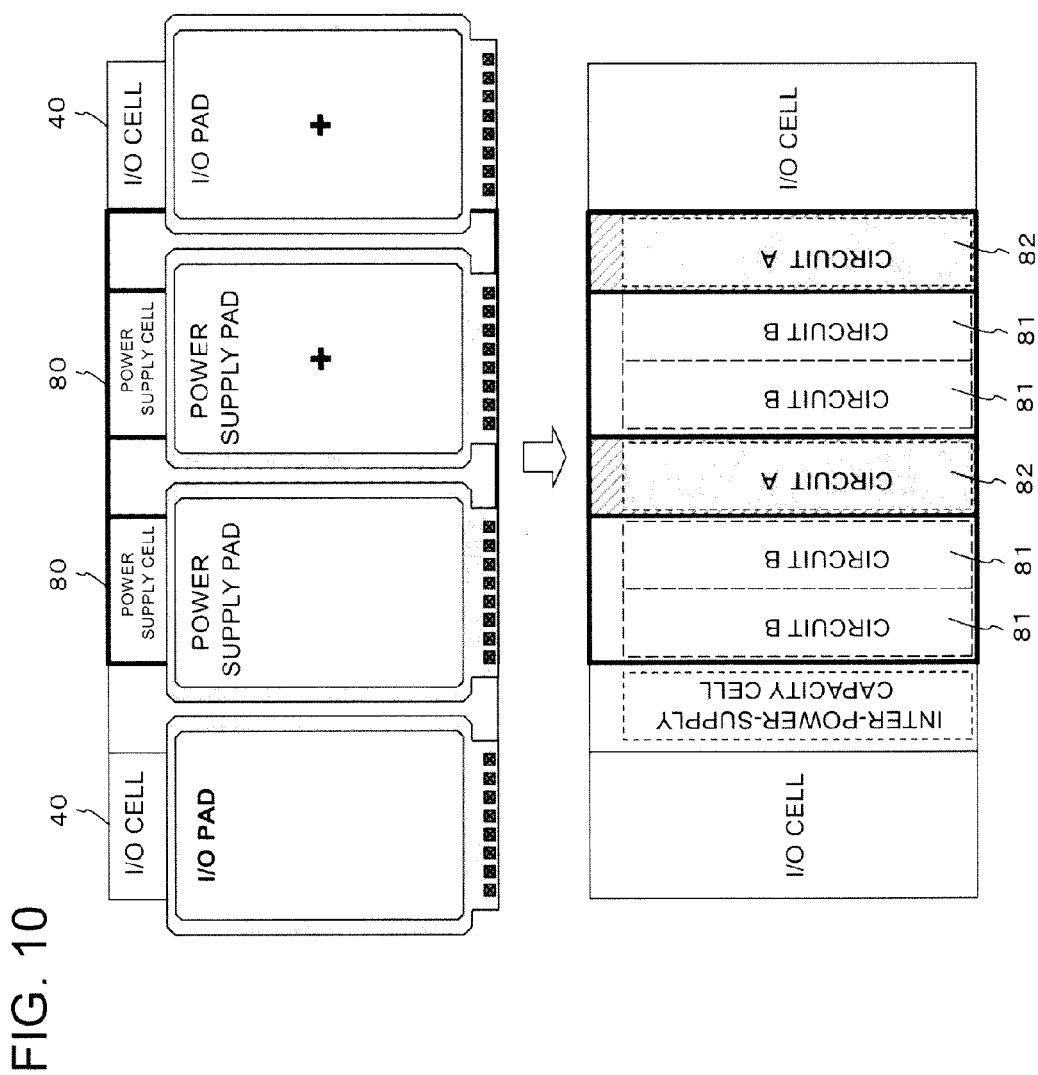
FIG. 10 is a layout diagram illustrating a configuration of a semiconductor integrated circuit device according to a fifth exemplary embodiment.

A semiconductor integrated circuit device according to a fifth exemplary embodiment will be described with reference to the drawings. The present exemplary embodiment provides a variation of the power supply cell (FIG. 8B). FIG. 10 is a layout diagram illustrating a configuration of a semiconductor integrated circuit device according to the present exemplary embodiment.

A power supply cell is created by dividing the circuit B of the power supply cell 80 illustrated in FIG. 8B into two columns and arranging the circuit A of the power supply cell 80 in a gap between cells. In this way, ESD resistance properties can be improved, without increasing the area in the cross direction (the cross direction in FIG. 10). In addition, as illustrated in FIG. 10, by arranging an inter-power-supply capacity cell in a gap available between cells, power supply stabilization can be achieved.

The disclosure of the above Patent Literatures is incorporated herein by reference thereto. Modifications and adjustments of the exemplary embodiment are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept. Particularly, any numerical range disclosed herein should be interpreted that any intermediate values or sub-ranges falling within the disclosed range are also concretely disclosed even without specific recital thereof.

REFERENCE SIGNS LIST

10, 110 level shifter region
11 level shifter circuit
12 I/O voltage region
13 core voltage region
20, 120 I/O logic region
21 I/O logic circuit
30, 130 I/O buffer region
31, 35, 131, 135 resistor region
32, 132 N buffer region
33, 34, 133, 134 diode element region
36, 136 P buffer region
37 I/O buffer circuit
40, 140 I/O cell
41, 141 core power supply wiring
42, 142 core ground wiring
43, 143, 145 I/O power supply wiring
44, 144, 146 I/O ground wiring
50, 150 pad
60, 160 core region
61 core logic circuit
70, 170 pad region
80 power supply cell
81 circuit A region
82 circuit B region
A, B circuit
C1 capacitive element
D1-D3 diode element DNW deep N-well
IN1, IN2 inverter
M1 MOS transistor
N1 N buffer (NMOS transistor)
NW N-type well
P1 P buffer (PMOS transistor)
PAD pad
P-Sub P-type substrate
PW P-type well
R1-R7 resistive element
T1-T5 transistor
VCCQ I/O power supply voltage
VDD core power supply voltage
VSS core ground voltage
VSSQ I/O ground voltage

What is claimed is:

1. A semiconductor integrated circuit device, comprising:
a core region in which core logic circuit is arranged; and
a plurality of I/O cells arranged in a first direction, each of the plurality of I/O cells comprising
a bonding pad,
an I/O logic circuit, and
an I/O buffer circuit,
wherein an I/O logic region in which the I/O logic circuit is arranged and an I/O buffer region in which the I/O buffer circuit is arranged are disposed under the bonding pad in plan view, and
wherein the I/O logic region and the I/O buffer region are arranged side by side in the first direction.

2. The semiconductor integrated circuit device according to claim 1, wherein
a deep N-well included in the I/O logic region and a deep N-well included in the I/O buffer region are separated from each other.

3. The semiconductor integrated circuit device according to claim 1, wherein
the I/O logic circuit and the I/O buffer circuit share a first wiring supplying a first voltage and a second wiring supplying a second voltage.

4. The semiconductor integrated circuit device according to claim 2, wherein
the I/O logic circuit and the I/O buffer circuit share a first wiring supplying a first voltage and a second wiring supplying a second voltage.

5. The semiconductor integrated circuit device according to claim 3, wherein
the first voltage and the second voltage are a power supply voltage and a ground voltage, respectively, for the I/O buffer circuit and the I/O logic circuit.

6. The semiconductor integrated circuit device according to claim 3,
wherein each of the plurality of I/O buffer circuit includes a level shifter circuit, a P buffer and an N buffer, and
wherein a P buffer region in which the P buffer is arranged is arranged beside a level shifter region in which the level shifter circuit is arranged.

7. The semiconductor integrated circuit device according to claim 3, wherein
the I/O buffer region comprises a PMOS transistor, an NMOS transistor, first and second resistive elements, and first and second diode elements,
the PMOS transistor has a gate terminal connected to the IO logic circuit, one of a source terminal and a drain terminal connected to a back-gate terminal and the first wiring, and the other one of the terminals connected to a first terminal of the first resistive element,
the first resistive element has a second terminal connected to the pad,
the first diode element is connected between the first wiring and the pad,
the NMOS transistor has a gate terminal connected to the IO logic circuit, one of a source terminal and a drain terminal is connected to a back-gate terminal and the second wiring, and the other one of the terminals is connected to a first terminal of the second resistive element,
the second resistive element has a second terminal connected to the pad, and
the second diode element is connected between the second wiring and the pad.

8. The semiconductor integrated circuit device according to claim 1,
wherein each of the plurality of I/O cells includes a level shifter circuit;
wherein the level shifter region in which the level shifter circuit is arranged includes:
a first voltage region in which a circuit supplying a first power supply voltage to the I/O logic circuit is arranged; and
a second voltage region in which a circuit supplying a second power supply voltage to the core logic circuit is arranged, and
wherein the first voltage region is arranged within the I/O logic region, and
the second voltage region is arranged between the core region and a pair of the I/O logic region and the I/O buffer region.

* * * * *